(12) United States Patent
Su et al.

(10) Patent No.: US 11,604,272 B2
(45) Date of Patent: Mar. 14, 2023

(54) METHODS AND SYSTEMS FOR OBJECT DETECTION

(71) Applicant: APTIV TECHNOLOGIES LIMITED, St. Michael (BB)

(72) Inventors: Yu Su, Wuppertal (DE); Weimeng Zhu, Wuppertal (DE); Florian Kästner, Bochum (DE); Adrian Becker, Leverkusen (DE)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 308 days.

(21) Appl. No.: 16/904,835

(22) Filed: Jun. 18, 2020

(65) Prior Publication Data

US 2021/0018615 A1  Jan. 21, 2021

(30) Foreign Application Priority Data

Jul. 18, 2019  (EP) ..................................... 19187019

(51) Int. Cl.
  *G01S 13/931* (2020.01)
  *G01S 13/89* (2006.01)

(52) U.S. Cl.
  CPC ............ *G01S 13/931* (2013.01); *G01S 13/89* (2013.01)

(58) Field of Classification Search
  CPC ................................ G01S 13/89; G01S 13/931
  See application file for complete search history.

(56) References Cited

U.S. PATENT DOCUMENTS

| 9,691,019 B1 | 6/2017 | Gulland et al. |
| 2019/0295282 A1* | 9/2019 | Smolyanskiy .......... G01S 17/89 |

(Continued)

FOREIGN PATENT DOCUMENTS

| DE | 10 2014 218092 A1 | 3/2016 |
| DE | 10 2017 220243 B3 | 2/2019 |
| DE | 10 2018 203591 B3 | 7/2019 |

OTHER PUBLICATIONS

Partial European Search Report for Application No. EP 19187019.5 dated Jan. 17, 2020.

(Continued)

*Primary Examiner* — Peter M Bythrow
(74) *Attorney, Agent, or Firm* — Carlson, Gaskey & Olds, P.C.

(57) ABSTRACT

A computer implemented method for object detection includes: determining a grid, the grid comprising a plurality of grid cells; determining, for a plurality of time steps, for each grid cell, a plurality of respective radar detection data, each radar detection data indicating a plurality of radar properties; determining, for each time step, a respective radar map indicating a pre-determined radar map property in each grid cell; converting the respective radar detection data of the plurality of grid cells for the plurality of time steps to a point representation of pre-determined first dimensions; converting the radar maps for the plurality of time steps to a map representation of pre-determined second dimensions, wherein the pre-determined first dimensions and the pre-determined second dimensions are at least partially identical; concatenating the point representation and the map representation to obtain concatenated data; and carrying out object detection based on the concatenated data.

15 Claims, 9 Drawing Sheets

(56) References Cited

U.S. PATENT DOCUMENTS

| | | | | |
|---|---|---|---|---|
| 2019/0371052 A1* | 12/2019 | Kehl | ............... | G06T 7/521 |
| 2019/0384303 A1* | 12/2019 | Muller | ............... | G01C 21/3407 |
| 2020/0124421 A1* | 4/2020 | Kang | ............... | G01C 21/30 |
| 2020/0158862 A1* | 5/2020 | Mahmoud | ............... | G01S 13/726 |
| 2020/0175315 A1* | 6/2020 | Gowaikar | ............... | G06V 10/40 |
| 2020/0233429 A1* | 7/2020 | Zhang | ............... | G01S 13/865 |
| 2020/0278423 A1* | 9/2020 | Rittberg | ............... | G01S 13/42 |
| 2021/0026355 A1* | 1/2021 | Chen | ............... | G06V 10/82 |
| 2021/0089058 A1* | 3/2021 | Stoschek | ............... | G01S 7/497 |

OTHER PUBLICATIONS

Anonymous: "Convolutional neural network—Wikipedia," Dec. 30, 2016, XP055641393, Retrieved from the Internet: URL:https://en.wikipedia.org/w/index.php?title=Convolutional_neural-network&oldid=757325988 [retrieved on Nov. 12, 2019].

Anonymous: "Recurrent neural network—Wikipedia," Apr. 7, 2018, XP055508783, Retrieved from the internet: URL https://en.wikipedia.org/w/index.php?title=Recurrent_neural_network&oldid=835281737 [retried on Sep. 21, 2018].

* cited by examiner

METHODS AND SYSTEMS FOR OBJECT DETECTION

CROSS REFERENCE TO RELATED APPLICATION

This application claims priority to European Patent Application No. EP 19187019.5, filed on Jul. 18, 2019.

TECHNICAL FIELD

The present disclosure relates to methods and systems for object detection. Radar detection data and radar map data may be combined and reduced in dimension to provide efficient object detection.

BACKGROUND

Radar is a commonly used sensor in automotive perception systems due to its low cost compared with LiDAR and high adaptability to environment changes (e.g. weather or lighting condition) compared with cameras.

Radar data is usually given in the form of point clouds. Each point is characterized by some features, e.g. its RCS (Radar Cross-Section), range rate (Doppler velocity) and spatial location. In automotive perception systems, it may be desired to carry out object detection (for example predicting the location and/or motion of objects and/or carrying out semantic segmentation for determining a semantic label of every location).

According to conventional methods, performance of predicting the location and/or motion of objects may still be improved.

Accordingly, there is a need to provide systems and methods for enhanced object detection.

SUMMARY

In one aspect, the present disclosure is directed at a computer implemented method for object detection. The method includes several steps carried out by computer hardware components, including: determining a grid, the grid comprising a plurality of grid cells; determining, for a plurality of time steps, for each grid cell, a plurality of respective radar detection data, each radar detection data indicating a plurality of radar properties; determining, for each time step, a respective radar map indicating a pre-determined radar map property in each grid cell; converting the respective radar detection data of the plurality of grid cells for the plurality of time steps to a point representation of pre-determined first dimensions; converting the radar maps for the plurality of time steps to a map representation of pre-determined second dimensions, wherein the pre-determined first dimensions and the pre-determined second dimensions are at least partially identical; concatenating the point representation and the map representation to obtain concatenated data; and carrying out object detection based on the concatenated data.

In other words, radar detection data (which may also be referred to as point-cloud data) and map data may be brought into respective representations which are of dimensions which are suitable for concatenating the representations. For example, the representations may be tensors, which have dimensions that match in all but one dimension. Concatenating these tensors may then lead to a tensor in which only the dimension, in which the tensors do not match, is changed (for example to the sum of the respective dimension of the tensors), while the dimensions in which the tensors match remains unchanged.

It has been found that combining (for example concatenating) radar detection data and map data into combined (for example concatenated) data may improve detection results when using the combined data as input data to a neural network.

According to another aspect, the computer implemented method may further comprise: receiving radar sensor data for each time step from a radar sensor provided on a vehicle; and preprocessing the radar sensor data to remove an effect of a change in location of the vehicle. The radar detection data and the radar maps may be determined based on the preprocessed radar sensor data.

The vehicle may be moving, i.e. the vehicle may change its location (for example change its position and/or its orientation). Removing the effect of the change in location of the vehicle (for example removing the effect of the change in position and orientation of the vehicle between two or more time steps) may provide that the radar sensor data is always given in the same global coordinate system. Removing the effect of the change in location of the vehicle may also be referred to as ego-location compensation.

According to another aspect, for each present time step, the radar sensor data may be preprocessed to remove the effect of the change in location of the vehicle based on the radar sensor data of the present time step and radar sensor data of a pre-determined number of previous time steps preceding the present time step.

Taking into account the radar sensor data of the present time step and a pre-determined number of previous time steps preceding the present time step when removing the effect of the change in location of the vehicle may provide a sliding window of constant (time) length, and may provide that all radar detection data and radar maps (that are converted into point representation and map representations and are then concatenated) are provided in the same coordinate system.

According to another aspect, for each time step, the respective radar map may comprise a motion map indicating a probability of existence of a radar point detection at a next time step. According to another aspect, for each time step, the respective radar map may comprise a positional uncertainty map indicating a positional uncertainty at the respective time step. According to another aspect, for each time step, the respective radar map may comprise an occupancy map indicating static object contours.

It will be understood that more than one kind of radar map may be provided, for example two of the motion map, positional uncertainty map, and occupancy map, or all three kinds of radar maps (motion maps, positional uncertainty maps, and occupancy maps). It will also be understood that in such a case, the steps of determining, for each time step, the respective radar map indicating the pre-determined radar map property (in other words: the property indicated by the radar map) in each grid cell may be provided for each kind of map, and the step of converting the radar map for the plurality of time steps to a map representation may be provided for each kind of map. The dimensions of the various map representations may at least partially be identical to the dimensions of the point representation. It will further be understood that the step of concatenating may include concatenating the points and the various kinds of maps.

According to another aspect, converting the respective radar detection data of the plurality of grid cells for the plurality of time steps to the point representation of pre-determined first dimensions may comprise reducing a dimension of points in each cell. Reducing the dimension of points in each cell may be also be referred to as squeezing. According to another aspect, reducing the dimension of points may comprise max pooling.

According to another aspect, the grid may comprise a pre-determined height and a pre-determined width; the point representation may comprise a four-dimensional tensor (which may be referred to as point tensor or as tensor of the point representation), wherein a first dimension of the point tensor corresponds to the number of the plurality of time steps, a second dimension of the point tensor corresponds to the height of the grid, and a third dimension of the point tensor corresponds to the width of the grid; and the map representation may comprise a four-dimensional tensor (which may be referred to as map tensor or as tensor of the map representation), wherein a first dimension of the map tensor corresponds to the number of the plurality of time steps, a second dimension of the map tensor corresponds to the height of the grid, and a third dimension of the map tensor corresponds to the width of the grid.

It has been found that with these dimensions of the tensors, an efficient concatenation of the point representation and the map representation may be carried out.

According to another aspect, the concatenated data may comprise a four-dimensional tensor (which may be referred to as concatenated tensor or as tensor of the concatenated data), wherein a first dimension of the concatenated tensor corresponds to the number of the plurality of time steps, a second dimension of the concatenated tensor corresponds to the height of the grid, a third dimension of the concatenated tensor corresponds to the width of the grid, and a fourth dimension of the concatenated tensor corresponds to the sum of a fourth dimension of the point tensor and a fourth dimension of the map tensor.

The concatenated data may be represented by a tensor which in all but one dimension matches the dimensions of the tensor of the point representation and the tensor of the map representation, and the remaining dimension may be the sum of the dimensions of the tensors of the point representation and the map representation. With such concatenated data, the point representation and the map representation may be provided in a unified set of data, which may increase the content of information, and may thus provide useful input for object detection.

According to another aspect, the computer implemented method may further comprise: reducing the dimension of the concatenated data to get time fused data, wherein the time fused data comprises a three-dimensional tensor (which may be referred to as time fused tensor or as tensor of the time fused data), wherein a first dimension of the time fused tensor corresponds to the height of the grid, a second dimension of the time fused tensor corresponds to the width of the grid, and a third dimension of the time fused tensor corresponds to the sum of a fourth dimension of the point tensor and a fourth dimension of the map tensor; wherein object detection is carried out based on the time fused data.

The time fused data may be represented by a tensor of a dimension which is one lower than the dimension of the tensor of the concatenated data. For example, the first dimension (for example corresponding to the time steps) may be removed (in other words: fused), for example the concatenated data may be represented by a four-dimensional tensor, and the time fused data may be represented by a three-dimensional tensor.

According to another aspect, reducing the dimension of the concatenated data may comprise using a 3D convolution. According to another aspect, reducing the dimension of the concatenated data may comprise using a recurrent network.

It has been found that 3D conv (3D convolution) or a recurrent network (for example LSTM) provide an efficient way of reducing the dimension of the concatenated data.

In another aspect, the present disclosure is directed at a computer system, said computer system comprising a plurality of computer hardware components configured to carry out several or all steps of the computer implemented method described herein.

The computer system may comprise a plurality of computer hardware components (for example a processing unit (in other words: processor), at least one memory unit (which may also be referred to as memory) and at least one non-transitory data storage, for example hard disk drive or solid-state drive). It will be understood that further computer hardware components may be provided and used for carrying out steps of the computer implemented method in the computer system. The non-transitory data storage and/or the memory unit may comprise a computer program for instructing the computer to perform several or all steps or aspects of the computer implemented method described herein, for example using the processing unit and the at least one memory unit.

In another aspect, the present disclosure is directed at a non-transitory computer readable medium comprising instructions for carrying out several or all steps or aspects of the computer implemented method described herein. The computer readable medium may be configured as: an optical medium, such as a compact disc (CD) or a digital versatile disk (DVD); a magnetic medium, such as a hard disk drive (HDD); a solid state drive (SSD); a read only memory (ROM), such as a flash memory; or the like. Furthermore, the computer readable medium may be configured as a data storage that is accessible via a data connection, such as an internet connection. The computer readable medium may, for example, be an online data repository or a cloud storage.

The present disclosure is also directed at a computer program for instructing a computer to perform several or all steps or aspects of the computer implemented method described herein.

BRIEF DESCRIPTION OF THE DRAWINGS

Exemplary embodiments and functions of the present disclosure are described herein in conjunction with the following drawings, showing schematically.

DETAILED DESCRIPTION

FIG. 1 to FIG. 7 show portions of a (neural) network structure according to various embodiments to process points, grid maps as well as time fusion. Processing shown in FIG. 1, FIG. 2, and FIG. 3 may provide the inputs, processing shown in FIG. 4 and FIG. 5 may provide a feature encoding layer, processing shown in FIG. 6 may provide a time fusion layer, and processing shown in FIG. 7 may provide object detection.

Deep convolutional neural networks (CNN) may be used for various perception tasks, e.g. object detection and/or semantic segmentation. The input to a neural network may be a multiple dimensional tensor, e.g. a 2-D tensor or a 3-D tensor, which may be defined in certain spatial coordinate system. Every grid cell may include either points or some pre-calculated features.

Figure 1:
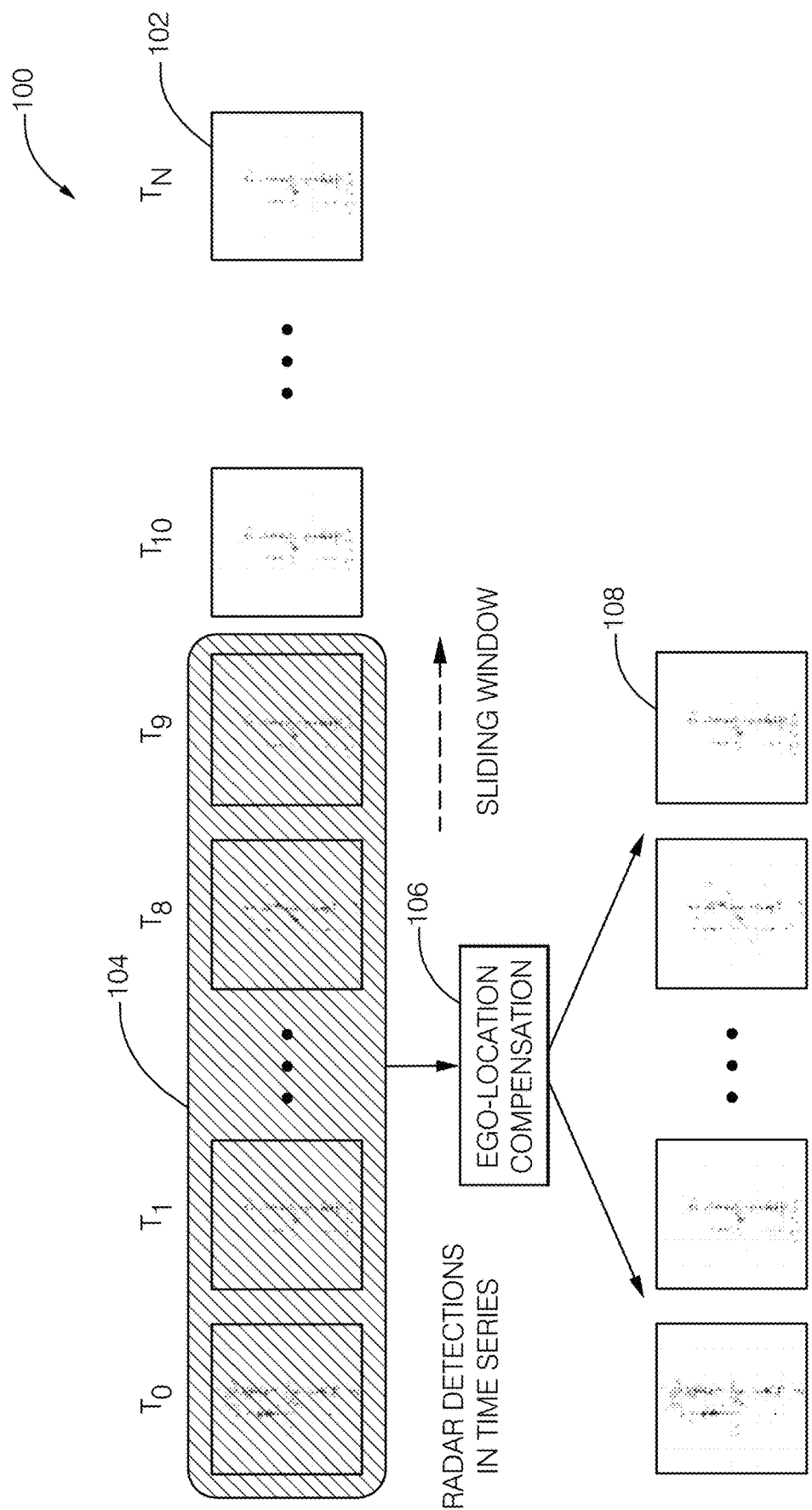
FIG. 1 is an illustration of generating ego-location compensated radar sensor data for further processing according to various embodiments.

FIG. 1 shows an illustration 100 of generating ego-location compensated radar sensor data for further processing according to various embodiments. A plurality of radar sensor data 102 at a plurality of time steps $T_0, T_1, \ldots, T_8, T_9, T_{10}, \ldots, T_N$ are illustrated. A sliding window 104 may be provided to use radar sensor data from a present time step (for example $T_9$ as illustrated in FIG. 1) and radar sensor data from a pre-determined number of preceding time steps (for example from 9 preceding time steps $T_0, T_1, \ldots, T_8$ as illustrated in FIG. 1), and may carry out ego-location compensation 106 based on the radar sensor data in the sliding window 104.

The ego-location compensated radar sensor data 108 may be used for further processing. According to various embodiments, points (in other words: point features or point properties) and one or more kinds of (precalculated) maps (for example motion maps, uncertainty maps and/or occupancy maps) may be determined based on the ego-location compensated radar sensor data 108, and may be provided to the network according to various embodiments as inputs sources.

Figure 2:
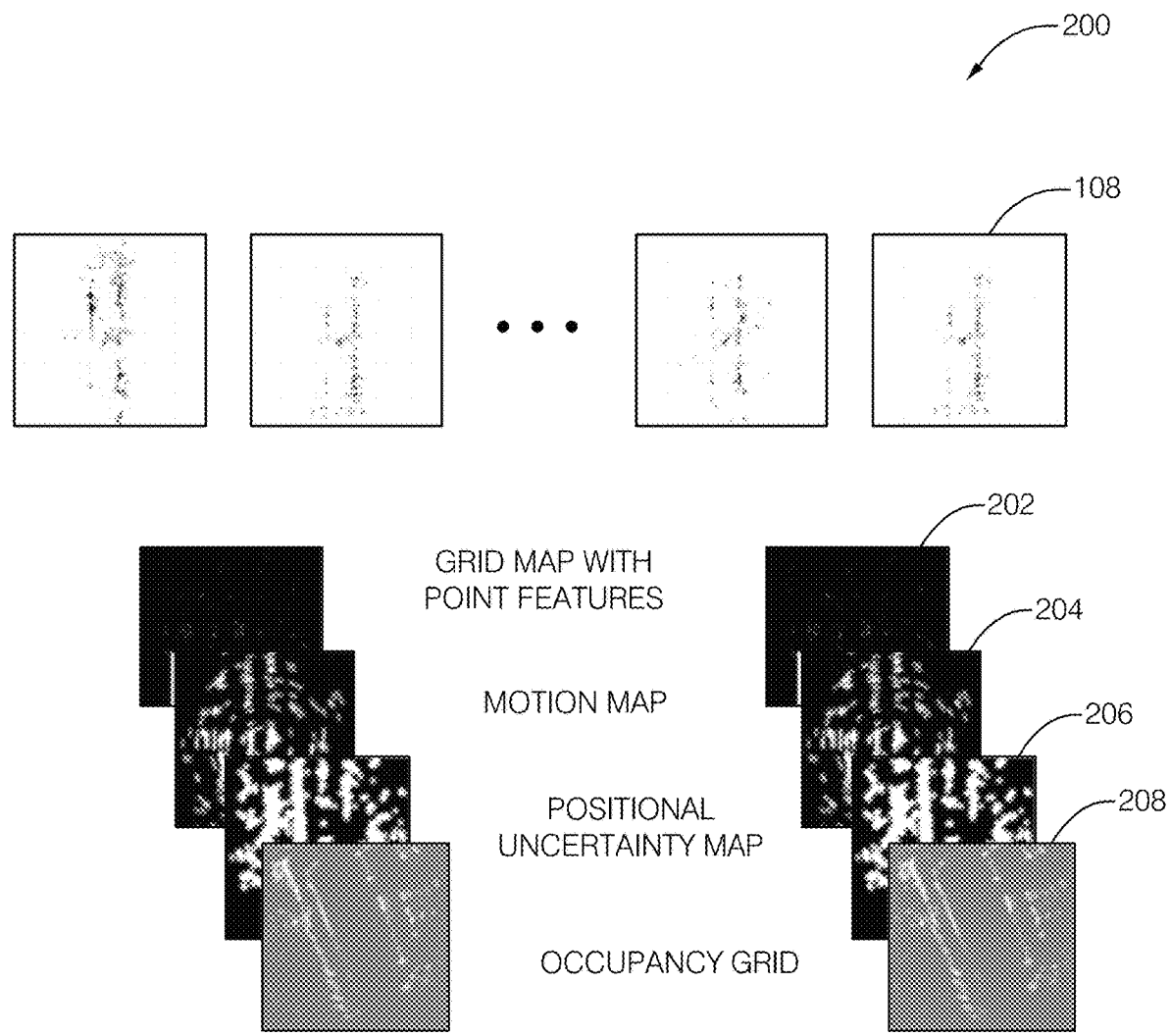
FIG. 2 is an illustration of generating radar detection data and radar maps according to various embodiments.

FIG. 2 shows an illustration 200 of generating radar detection data and radar maps according to various embodiments. The ego-location compensated radar sensor data 108 may be processed to obtain grid maps with point features 202, motion maps 204, positional uncertainty maps 206, and occupancy maps 208 (in other words: occupancy grids). Like illustrated in FIG. 2, respective maps or grids may be determined for each time step, so that a plurality of maps and grids are determined.

Radar points can be assigned to grid cells according to their spatial positions to obtain the grid maps with point features 202 (for example RCS, range rate, absolute position, relative position to cell center etc.). This may be done outside the network in an offline manner. The scope and resolution of the grid may be pre-defined. For example, the grid may have a width W and a height H, so that the grid has W×H grid cells. After assignment, every grid cell may include a fixed (pre-defined or pre-determined) number of points. If there are less points in a cell than the fixed number, upsampling is used, otherwise downsampling is used. Every point is represented by some features e.g. RCS, range rate, absolute position, relative position to cell center etc. Therefore, the input data from points may be represented by a tensor of dimension H×W×N×F, where N is the number of points in each cell and F is the number of point features.

Motion maps may be represented by a tensor of dimension $H \times W \times C_M$, wherein $C_M$ represents the numbers of feature channels in the motion map. Motion maps may spread the point information of a Doppler speed measurement to into space where convolutional layers (for example of neural networks) are able to encode strong semantic features. Motion maps may represent the cumulative probability of existence of radar point detections in the next frame (in other words: at the next time step). For example, the radial ego-motion (or ego-location) compensated component of the object speed may be calculated. Therefore, for each radar point detection, the radial covered distance may be computed. The uncertainty of the translative covered distance may be drawn as a line. Additionally, a Gaussian uncertainty along this line may be drawn in radial direction. The length of this line may be set to a given value and symmetric to the center of the original point position. The update of each gridcell may be done in a cumulative manner. An example of a motion map design will be provided below with reference to FIG. 8.

Uncertainty maps may be represented by a tensor of dimension $H \times W \times C_U$, wherein $C_U$ represents the numbers of feature channels in the uncertainty map. Uncertainty maps may represent the positional uncertainty in the current frame (in other words: at the current time step). Using an inverse sensor model, similar to the creation of occupancy gridmaps, this uncertainty may be computed depending on the azimuth, distance and sensor properties, for example look type and range/angle measurement uncertainties. The positional uncertainty may get lower the farther the grid cell is away from the determined measured position. The update of each gridcell may be done in a cumulative manner.

Occupancy maps may be represented by a tensor of dimension $H \times W \times C_o$, wherein $C_o$ represents the numbers of feature channels in the occupancy map. Occupancy maps may apply time fusion in order to create a map of only static object contours. Moving objects may rarely be visible in this kind of maps. First, the uncertainty map of each frame is ego-location compensated to a given time. Then, this maps are fused in a Bayes scheme. Each grid cell may represent their probability of object existence. The more radar point detections contribute to a cell, the higher the probability of existence will be.

Figure 3:
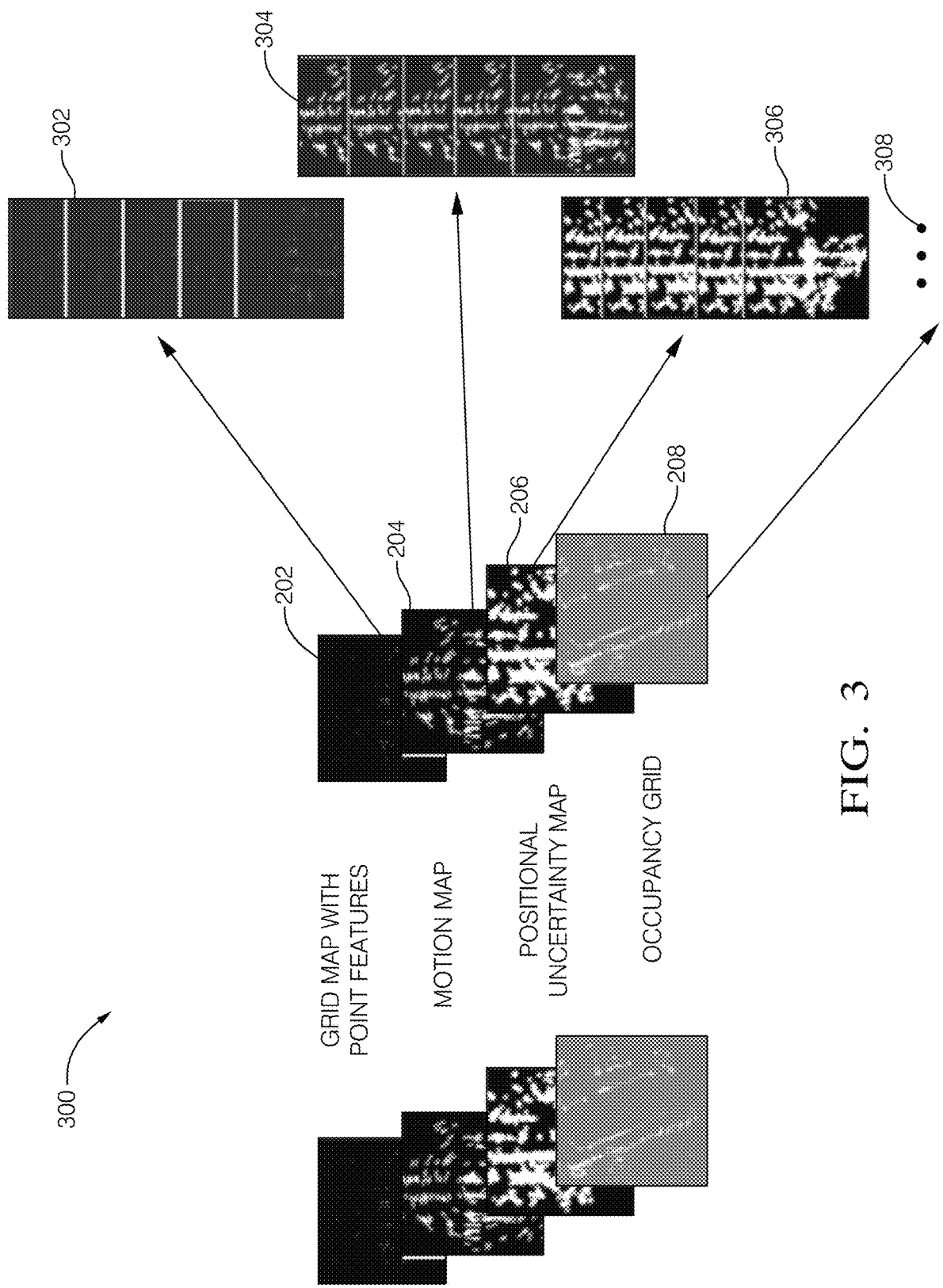
FIG. 3 is an illustration of a stacking process according to various embodiments.

FIG. 3 shows an illustration 300 of a stacking process according to various embodiments. Radar points from single time step are often not stable, and meaningful information may be inferred only by considering multiple frames. According to various embodiments, multiple frames may be stacked together to encode temporal information. In the stacking process, ego-motion may be considered to compensate the moving of ego-vehicle (in other words: of the vehicle on which the radar sensor is provided). As such, all the points from stationary objects may always be at the same grid position within multiple frames.

Grid maps with point features 202 of various time steps may be stacked to obtain a stacked grid map with point features 302 (which may be represented by a tensor of dimensions T×H×W×N×F, wherein T may denote the number of time steps that are stacked). Motion maps 204 of various time steps may be stacked to obtain a stacked motion map 304 (which may be represented by a tensor of dimensions $T \times H \times W \times C_M$). Positional uncertainty maps 206 of various time steps may be stacked to obtain a stacked positional uncertainty map 306 (which may be represented by a tensor of dimensions $T \times H \times W \times C_U$). Occupancy grids 208 of various time steps may be stacked to obtain a stacked occupancy grid (which may be represented by a tensor of dimensions T×H×W×$C_o$). Like indicated by points 308 further maps of various time steps may be stacked. The stacked maps and grids may be provided as input to a (neural) network for further processing.

The neural network for object detection according to various embodiments may take the input of 3D tensor (H×W×C) where C is the number of feature channels. It will be understood that commonly used neural networks may be used. According to various embodiments, a feature encoding layer is provided to convert the inputs (one 5D tensor and three 4-D tensor) into a unified 3D tensor. According to various embodiments, the feature encoding layer may extract features from points and maps, may squeeze the dimension of points (e.g. by max pooling) and may then concatenate all of them to get a unified 4D tensor (of dimensions T×H×W×F', wherein F' is the sum of the fourth dimension of the representations to be concatenated).

Figure 4:
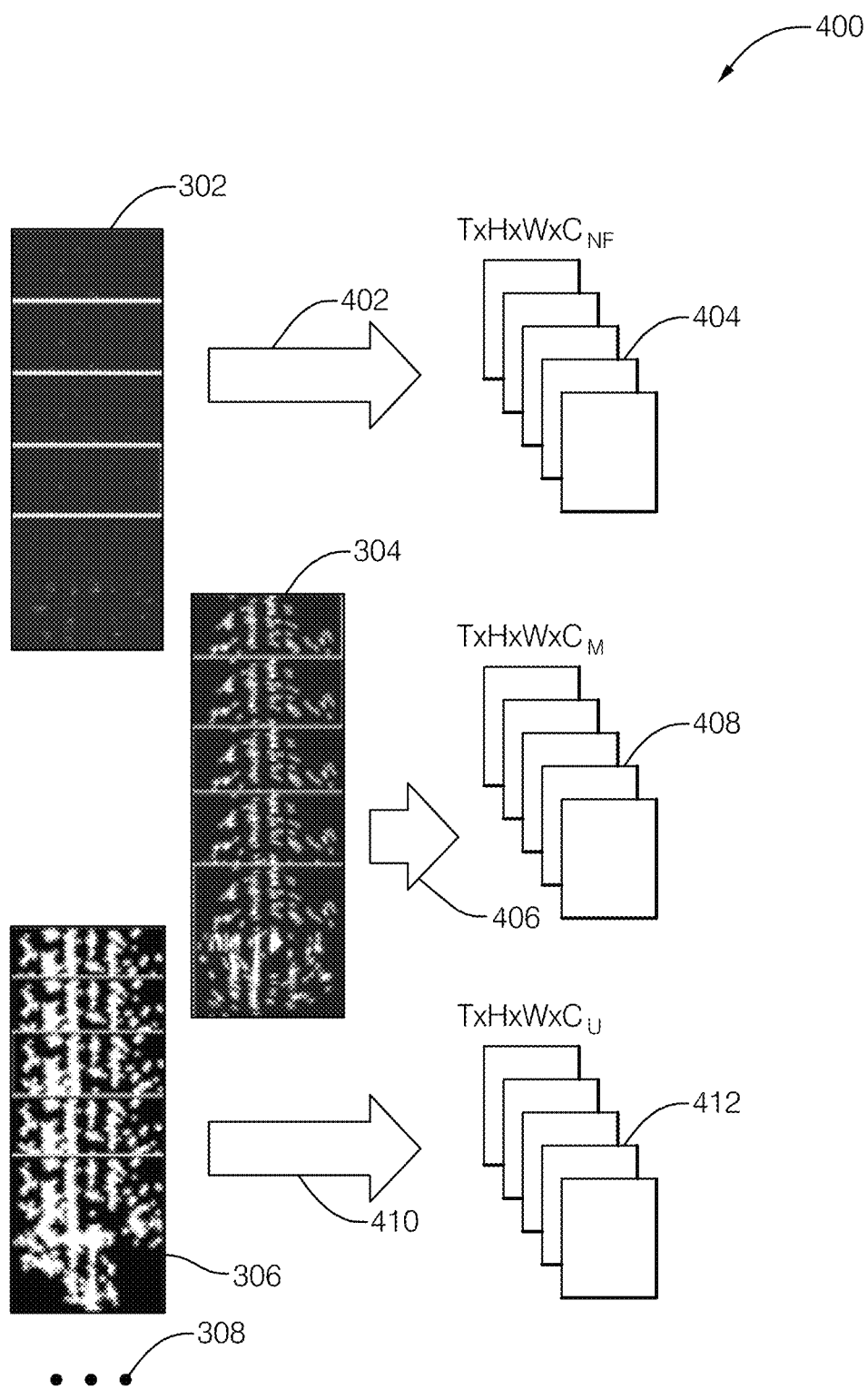
FIG. 4 is an illustration of feature encoding according to various embodiments.

FIG. 4 shows an illustration 400 of feature encoding according to various embodiments. The stacked grid map with point features 302 may be processed by time-distributed convolutions 402, to obtain a point representation 404 (for example a 4D-tensor, for example of dimensions T×H×W×$C_{NF}$, wherein $C_{NF}$ is a dimension that results from squeezing the dimension N×F of point features). The stacked motion map 304 may be processed by time-distributed convolutions 406 to obtain a motion map representation 408 (for example a 4D-tensor, for example of dimensions T×H×W×$C_M$). The stacked positional uncertainty map 306 may be processed by time-distributed convolutions 410 to obtain a positional uncertainty map representation 412 (for example a 4D-tensor, for example of dimensions T×H×W×$C_U$). Further stacked maps may be processed accordingly (for example by time-distributed CNNs) to get further map representations (for example 4D-tensors).

Figure 5:
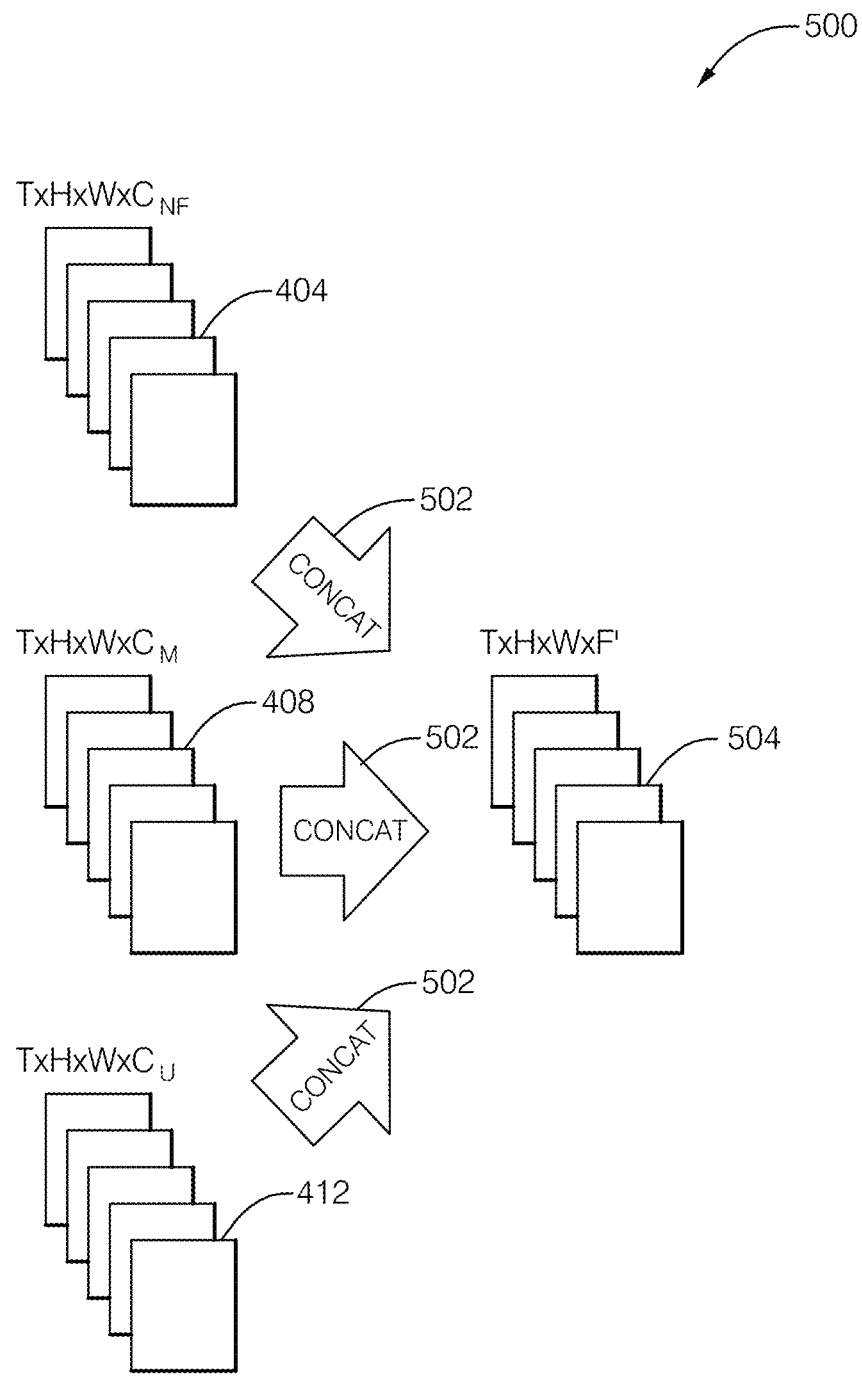
FIG. 5 is an illustration of concatenating representations according to various embodiments.

FIG. 5 shows an illustration 500 of concatenating representations according to various embodiments. The point representation 404, the motion map representation 408, and the positional uncertainty map representation 412 may be concatenated, like illustrated by arrows 502, to obtain concatenated data 504. It will be understood that concatenation is possible since the point representation 404, the motion map representation 408, and the positional uncertainty map representation 412 have dimensions which are at least partially identical (for example, the first dimension (corresponding to the number of time steps, for example 5), the second dimension (corresponding to the height of the grid, for example 160), and the third dimension (corresponding to the width of the grid, for example 160) are identical for the point representation 404, the motion map representation 408, and the positional uncertainty map representation 412. The concatenated data 504 may be a tensor of dimensions T×H×W×F' (wherein F' may be the sum of the channel dimensions of the data to be concatenated; in the example of FIG. 5, it may hold that F'=$C_{NF}$+$C_M$+$C_U$).

The first dimension of the concatenated data 504 may be identical to the first dimension of the point representation 404, and identical to the first dimension of the motion map representation 408, and identical to the first dimension of the positional uncertainty map representation 412. The second dimension of the concatenated data 504 may be identical to the second dimension of the point representation 404, and identical to the second dimension of the motion map representation 408, and identical to the second dimension of the positional uncertainty map representation 412. The third dimension of the concatenated data 504 may be identical to the third dimension of the point representation 404, and identical to the third dimension of the motion map representation 408, and identical to the third dimension of the positional uncertainty map representation 412.

The fourth dimension of the concatenated data 504 (for example 128 as illustrated in FIG. 5) may be identical to the sum of the fourth dimension of the point representation 404 (for example 64 as illustrated in FIG. 5), the fourth dimension of the motion map representation 408 (for example 32 as illustrated in FIG. 5), and the fourth dimension of the positional uncertainty map representation 412 (for example 32 as illustrated in FIG. 5).

A time fusion layer may be provided to squeeze the time dimension. For example, 3D cony or a recurrent network (for example LSTM) may be used on the time dimension. The output of this layer may be H×W×F" (with an integer number F"), which may be directly used by an object detection network.

Figure 6:
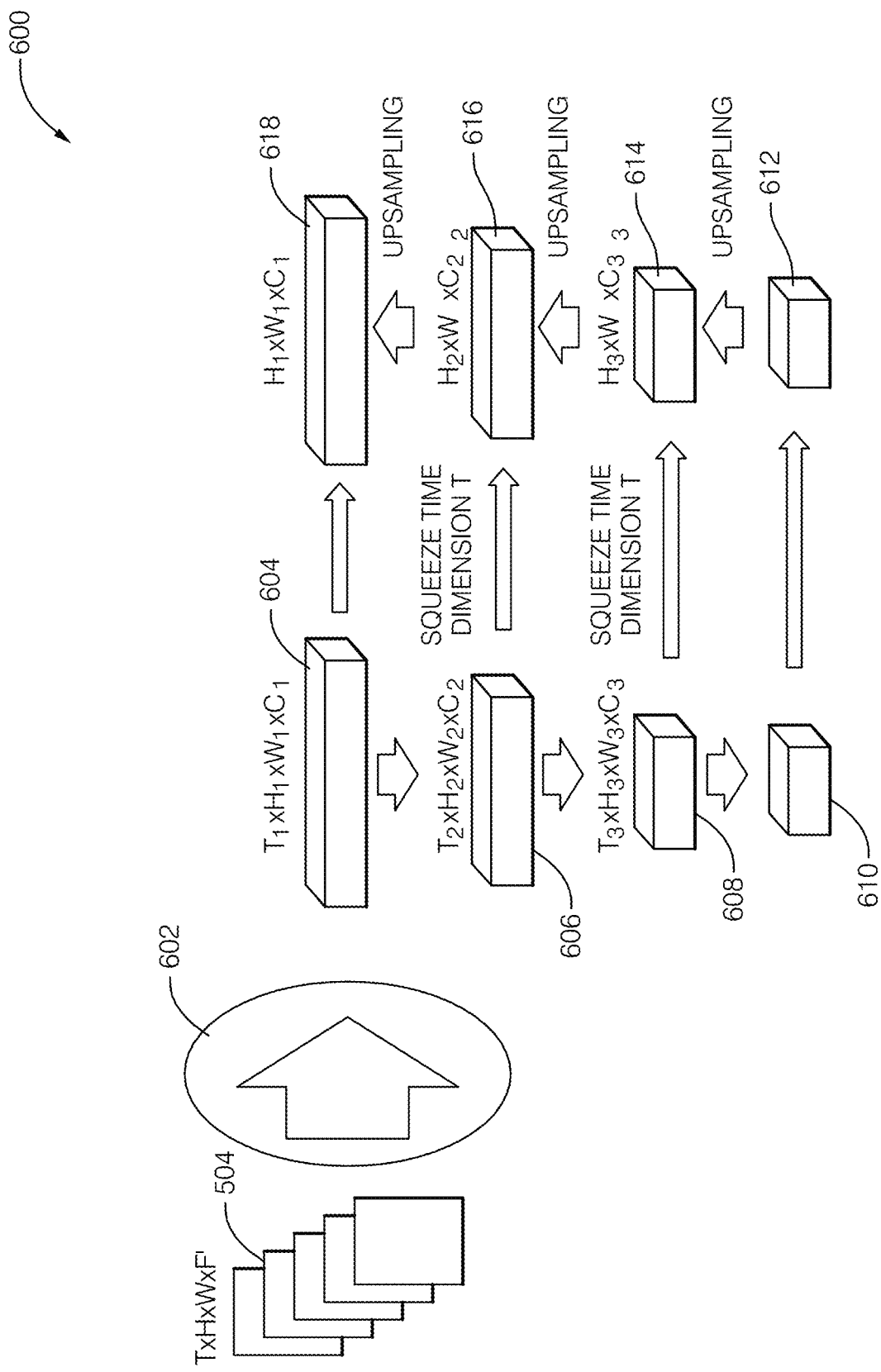
FIG. 6 is an illustration of time squeezing according to various embodiments.

FIG. 6 shows an illustration 600 of time squeezing according to various embodiments. The concatenated data may be provided using time-distributed convolutions (for example using 3D-cony or LSTM) 602, to obtain a pyramid with levels of data of reduced size and upsampled size. A first level 604 (for example of dimension $T_1$×$H_1$×$W_1$×$C_1$, which may be identical to T×H×W×F') may be processed, for example using convolutions and/or max pooling to obtain a second level 606 of reduced size (for example $T_2$×$H_2$×$W_2$×$C_2$). Further size reduction may be applied, to obtain further levels (of which levels 608 (for example with dimensions $T_3$×$H_3$×$W_3$×$C_3$ and 610 are illustrated; it will however be understood that further levels may be present). It will be understood that level 610 may be a scalar, so that level 612 is identical to level 610. Level 614 may be obtained based on upsampling level 612 and based on level 608, for example by squeezing the time dimension. Data of level 614 may have dimensions $H_3$×$W_3$×$C_3$, i.e. compared to the dimension of level 608, the time dimension T may be squeezed. Further upsampled levels may be provided, of which levels 616 and 618 are illustrated; it will however be understood that further upsampled levels may be present. Data of level 616 may have dimensions $H_2$×$W_2$×$C_2$, i.e. compared to the dimension of level 606, the time dimension T may be squeezed. Data of level 618 may have dimensions $H_1$×$W_1$×$C_1$, i.e. compared to the dimension of level 604, the time dimension T may be squeezed. Any of the levels 616, 618, or the further levels may be obtained based on a lower level that has been obtained based on upsampling and time squeezing (for example a level illustrated in FIG. 6 below the respective level), and a level that was obtained by downsampling (for example a level illustrated in FIG. 6 left from the respective level). In the levels that were obtained by downsampling, for example levels 604, 606, 608, 610, may be processed to squeeze time dimension T, to obtain levels 618, 616, 614, 612, respectively. Various methods may be used for squeezing the time dimension, for example taking one of the subtensors for a fixed time value (in other words: taking one of the T maps), averaging over all time values (in other words: averaging over all maps along T dimension), taking a maximal or minimal value of all subtensors (in other words: maps) along T dimension, add-up values of all subtensors (in other words: maps) along T dimension, or any other method for removing or reducing the time dimension. The output of level 618 may be used for object detection.

Figure 7:
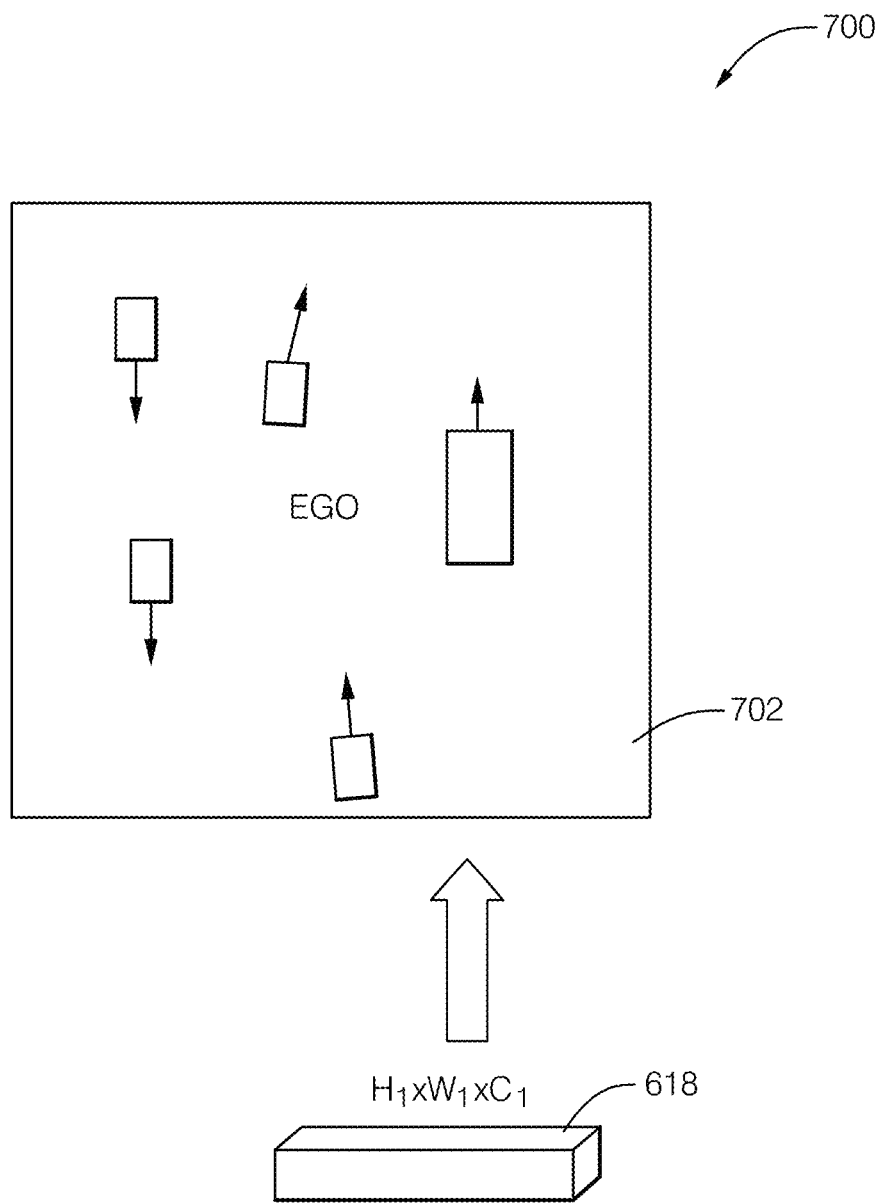
FIG. 7 is an illustration of object detection according to various embodiments.

FIG. 7 shows an illustration 700 of object detection according to various embodiments. The output of level 618 may be used for object detection 702, for example using an anchor-based object detection network, for example using Retinanet (or a similar network) on each pyramid level feature map, or any other object detection method.

Figure 8:
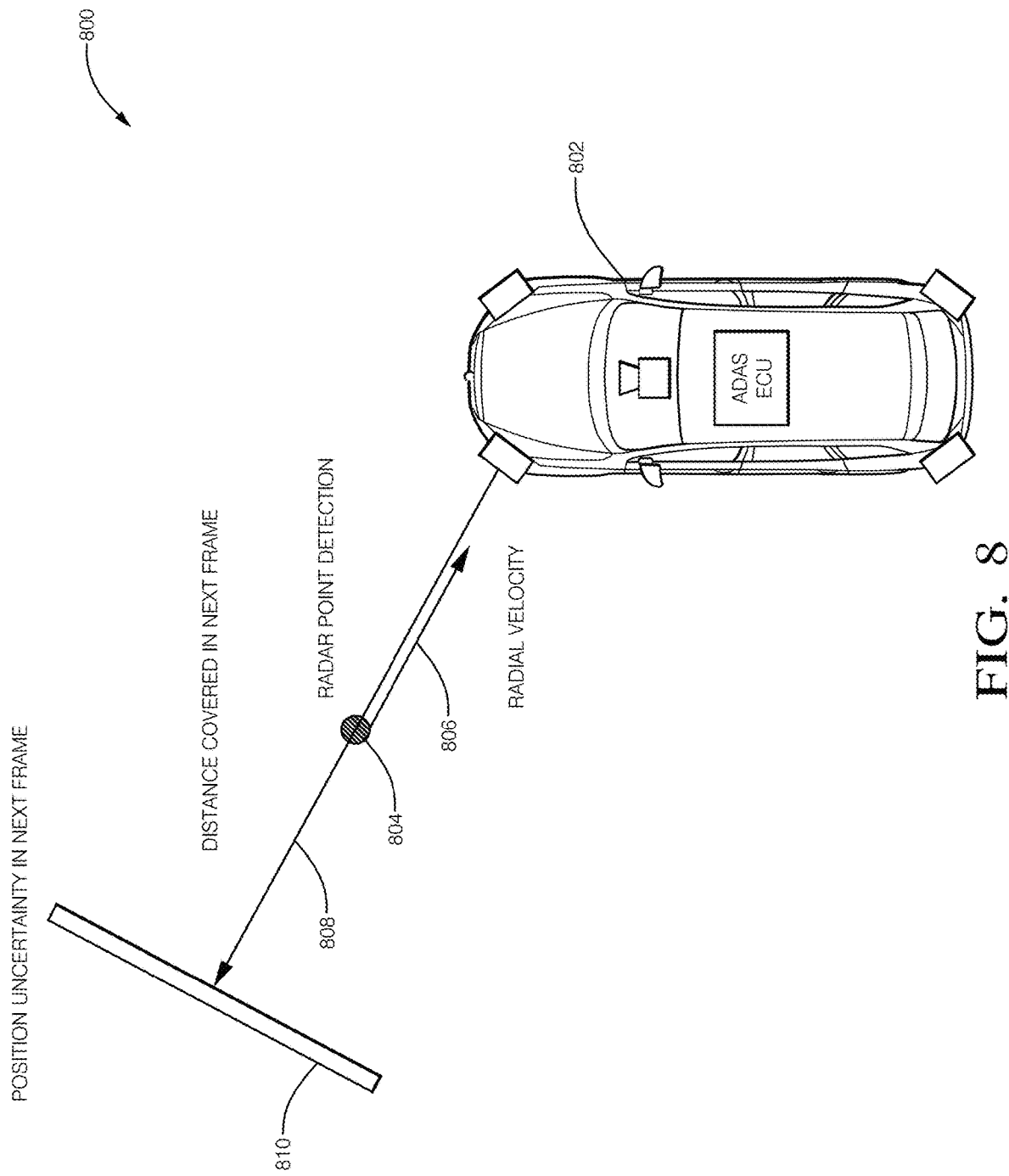
FIG. 8 shows an illustration of a motion map design for instantaneous probability calculation in a next frame according to various embodiments.

FIG. 8 shows an illustration 800 of a motion map design for instantaneous probability calculation in a next frame (in other words: at a next (in other words: subsequent) time step) according to various embodiments. A vehicle 802 with a radar sensor 802, a radar point detection 804, a radial velocity 806, a distance 808 covered in the next frame, and a positional uncertainty 810 in the next frame are illustrated.

Figure 9:
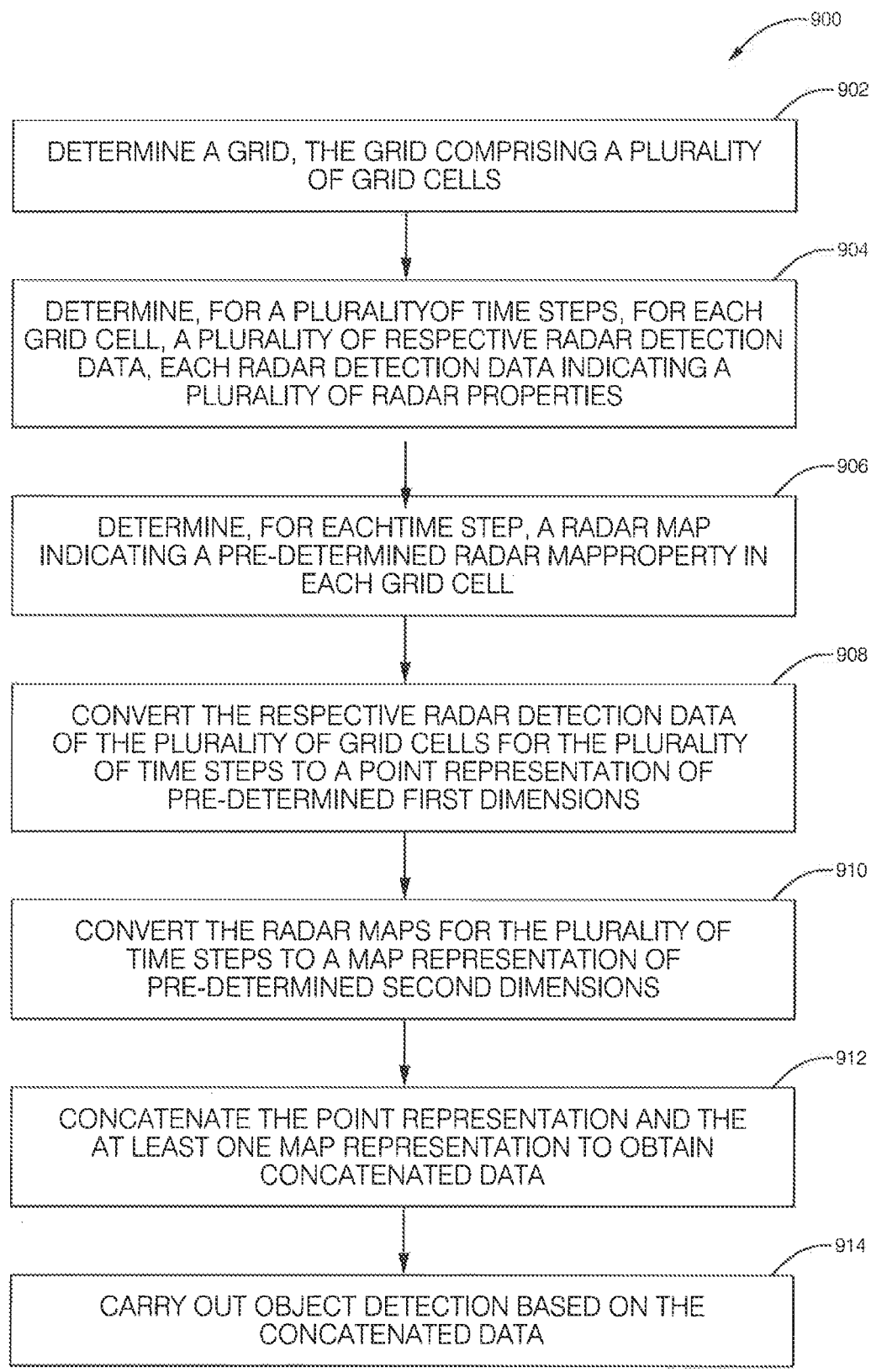
FIG. 9 is a flow diagram illustrating a computer implemented method for object detection according to various embodiments.

FIG. 9 shows a flow diagram 900 illustrating a computer implemented method for object detection according to various embodiments. At 902, a grid may be determined. The grid may include a plurality of grid cells. At 904, a plurality of respective radar detection data for each grid cell may be determined for a plurality of time steps. Each radar detection data may indicate a plurality of radar properties. At 906, a respective radar map indicating a pre-determined radar map property in each grid cell may be determined for each time step. At 908, the respective radar detection data of the plurality of grid cells for the plurality of time steps may be converted to a point representation of pre-determined first dimensions. At 910, the radar maps for the plurality of time steps may be converted to a map representation of pre-determined second dimensions. The pre-determined first dimensions and the pre-determined second dimensions may be at least partially identical. At 912, the point representation and the map representation may be concatenated to obtain concatenated data. At 914, out object detection may be carried based on the concatenated data.

According to various embodiments, the computer implemented method may further comprise receiving radar sensor data for each time step from a radar sensor provided on a vehicle; and preprocessing the radar sensor data to remove an effect of a change in location of the vehicle. The radar detection data and the radar maps may be determined based on the preprocessed radar sensor data.

According to various embodiments, for each present time step, the radar sensor data may be preprocessed to remove the effect of the change in location of the vehicle based on the radar sensor data of the present time step and radar sensor data of a pre-determined number of previous time steps preceding the present time step.

According to various embodiments, for each time step, the respective radar map may comprise a motion map indicating a probability of existence of a radar point detection at a next time step.

According to various embodiments, for each time step, the respective radar map may comprise a positional uncertainty map indicating a positional uncertainty at the respective time step.

According to various embodiments, for each time step, the respective radar map may comprise an occupancy map indicating static object contours.

According to various embodiments, converting the respective radar detection data of the plurality of grid cells for the plurality of time steps to the point representation of pre-determined first dimensions may include reducing a dimension of points in each cell.

According to various embodiments, reducing the dimension of points may include max pooling.

According to various embodiments, the grid may comprise a pre-determined height and a pre-determined width. The point representation may comprise a four-dimensional point tensor. A first dimension of the point tensor may correspond to the number of the plurality of time steps, a second dimension of the point tensor may correspond to the height of the grid, and a third dimension of the point tensor may correspond to the width of the grid. The map representation may comprise a four-dimensional map tensor. A first dimension of the map tensor may correspond to the number of the plurality of time steps, a second dimension of the map tensor may correspond to the height of the grid, and a third dimension of the map tensor may correspond to the width of the grid.

According to various embodiments, the concatenated data may comprise a four-dimensional concatenated tensor. A first dimension of the concatenated tensor may correspond to the number of the plurality of time steps, a second dimension of the concatenated tensor may correspond to the height of the grid, a third dimension of the concatenated tensor may correspond to the width of the grid, and a fourth dimension of the concatenated tensor may correspond to the sum of a fourth dimension of the point tensor and a fourth dimension of the map tensor.

According to various embodiments, the computer implemented method may further comprise: reducing the dimension of the concatenated data to get time fused data. The time fused data may comprise a three-dimensional time fused tensor. A first dimension of the time fused tensor may correspond to the height of the grid, a second dimension of the time fused tensor may correspond to the width of the grid, and a third dimension of the time fused tensor may correspond to the sum of a fourth dimension of the point tensor and a fourth dimension of the map tensor. Object detection may be carried out based on the time fused data.

According to various embodiments, reducing the dimension of the concatenated data may comprise using a 3D convolution. According to various embodiments, reducing the dimension of the concatenated data may comprise using a recurrent network.

Each of the steps 902, 904, 906, 908, 910, 912, 914 and the further steps described above may be performed by computer hardware components.

As described above, according to various embodiments, object detection based on radar point cloud and temporal fusion may be provided.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A computer implemented method for object detection, the method comprising:
   determining, by at least one processor, for a plurality of time steps, for each of a plurality of grid cells of a grid, a plurality of respective radar detection data, each radar detection data indicating a plurality of radar properties;
   determining, by the at least one processor, for each time step, a respective radar map indicating a pre-determined radar map property in each grid cell;
   converting, by the at least one processor, the respective radar detection data of the plurality of grid cells for the plurality of time steps to a point representation of pre-determined first dimensions;
   converting, by the at least one processor, the radar maps to a map representation of pre-determined second dimensions, wherein the pre-determined first dimensions and the pre-determined second dimensions are at least partially identical;

concatenating, by a neural network, the point representation and the map representation to obtain concatenated data; and carrying out object detection based on the concatenated data.

2. The computer implemented method of claim 1, comprising:

receiving radar sensor data for each time step from a radar sensor provided on a vehicle; and preprocessing the radar sensor data to remove an effect of a change in location of the vehicle;

wherein the radar detection data and the radar maps are determined based on the preprocessed radar sensor data.

3. The computer implemented method of claim 2, wherein, for each time step, the radar sensor data is preprocessed to remove the effect of the change in location of the vehicle based on the radar sensor data of the time step and radar sensor data of a pre-determined number of previous time steps preceding the time step.

4. The computer implemented method of claim 1, wherein, for each time step, the respective radar map comprises a motion map indicating a probability of existence of a radar point detection at a next time step.

5. The computer implemented method of claim 1, wherein, for each time step, the respective radar map comprises a positional uncertainty map indicating a positional uncertainty at the respective time step.

6. The computer implemented method of claim 1, wherein, for each time step, the respective radar map comprises an occupancy map indicating static object contours.

7. The computer implemented method of claim 1, wherein converting the respective radar detection data of the plurality of grid cells for the plurality of time steps to the point representation of pre-determined first dimensions comprises reducing a dimension of points in each cell.

8. The computer implemented method of claim 7, wherein reducing the dimension of points comprises max pooling.

9. The computer implemented method of claim 1, wherein the grid comprises a pre-determined height and a pre-determined width, the point representation comprises a four-dimensional point tensor, a first dimension of the point tensor corresponds to the number of the plurality of time steps, a second dimension of the point tensor corresponds to the height of the grid, a third dimension of the point tensor corresponds to the width of the grid, the map representation comprises a four-dimensional map tensor, a first dimension of the map tensor corresponds to the number of the plurality of time steps, a second dimension of the map tensor corresponds to the height of the grid, and a third dimension of the map tensor corresponds to the width of the grid.

10. The computer implemented method of claim 9, wherein the concatenated data comprises a four-dimensional concatenated tensor, a first dimension of the concatenated tensor corresponds to the number of the plurality of time steps, a second dimension of the concatenated tensor corresponds to the height of the grid, a third dimension of the concatenated tensor corresponds to the width of the grid, and a fourth dimension of the concatenated tensor corresponds to the sum of a fourth dimension of the point tensor and a fourth dimension of the map tensor.

11. The computer implemented method of claim 9, comprising reducing the dimension of the concatenated data to get time fused data, and wherein the time fused data comprises a three-dimensional time fused tensor, a first dimension of the time fused tensor corresponds to the height of the grid, a second dimension of the time fused tensor corresponds to the width of the grid, a third dimension of the time fused tensor corresponds to the sum of a fourth dimension of the point tensor and a fourth dimension of the map tensor, and object detection is carried out based on the time fused data.

12. The computer implemented method of claim 11, wherein reducing the dimension of the concatenated data comprises using a 3D convolution.

13. The computer implemented method of claim 11, wherein reducing the dimension of the concatenated data comprises using a recurrent network.

14. A computer system comprising a plurality of computer hardware components configured to carry out the computer implemented method of claim 1.

15. A non-transitory computer readable medium comprising instructions for carrying out the computer implemented method of claim 1.

* * * * *